(12) United States Patent
Gralenski

(10) Patent No.: US 7,294,197 B1
(45) Date of Patent: Nov. 13, 2007

(54) FORMATION OF A SILICON SHEET BY COLD SURFACE CASTING

(76) Inventor: Nicholas Gralenski, 1797 Cheryl Way, Aptos, CA (US) 95003

( * ) Notice: Subject to any disclaimer, the term of this patent is extended or adjusted under 35 U.S.C. 154(b) by 628 days.

(21) Appl. No.: 10/918,681

(22) Filed: Aug. 13, 2004

Related U.S. Application Data

(60) Provisional application No. 60/494,845, filed on Aug. 13, 2003.

(51) Int. Cl.
*C30B 13/24* (2006.01)
(52) U.S. Cl. ............... 117/37; 117/38; 117/43; 117/44; 117/47; 117/201; 117/202; 117/931; 118/405
(58) Field of Classification Search ............ 117/37, 117/38, 43, 44, 47, 201, 202, 931; 118/405
See application file for complete search history.

(56) References Cited

U.S. PATENT DOCUMENTS

| | | | | |
|---|---|---|---|---|
| 4,637,855 A | * | 1/1987 | Witter et al. ............... | 117/76 |
| 5,431,127 A | * | 7/1995 | Stevens et al. ............. | 117/75 |
| 5,614,020 A | * | 3/1997 | Stevens et al. ............. | 117/205 |
| 6,451,277 B1 | * | 9/2002 | Lord ........................... | 423/349 |

* cited by examiner

*Primary Examiner*—Robert Kunemund
(74) *Attorney, Agent, or Firm*—Michael Hetherington

(57) ABSTRACT

Metallurgical grade silicon or high purity silicon beads developed from a fluidized bed process are melted in a cooled aluminum crucible, such that a non wetted interface is created between the molten silicon and a cooled supporting substrate that includes a surface layer of substantially inert aluminum oxide. It is believed that the molten silicon does not wet the surface of the supporting substrate and the surface of the supporting substrate does not chemically interact with the silicon. It is shown that, in spite of the enormous temperature difference, molten silicon (ca. 1450° C.) can be stabilized, by appropriate energy control, in direct (but non-wetted) contact with cold (ca. 40° C.) material such as aluminum.

7 Claims, 4 Drawing Sheets

(SECTION A-A FIG.1)

FIG. 2 (SECTION A-A FIG. 1)

FORMATION OF A SILICON SHEET BY COLD SURFACE CASTING

CROSS-REFERENCE TO RELATED APPLICATION

This patent application claims the benefit of U.S. provisional patent application Ser. No. 60/494,845, filed Aug. 13, 2003, which is incorporated herein by reference.

BACKGROUND

1. Field of the Invention

The field of the invention generally relates to fabrication of silicon wafers. In particular, the field of the invention generally relates to a method and apparatus for forming a silicon wafer of extremely high purity by melting silicon in a crucible comprising cooled aluminum or other suitable material such that a non-wetted interface is created wherein the silicon does not wet nor interact with the surface of the crucible.

2. Background of Related Art

Silicon is the basic raw material of the semiconductor and solar cell industries. Second only to oxygen, silicon is the most common material on earth. However, it does not occur in the free state, only in myriad of mineral combinations. Silicon must thus be refined and purified for industrial use.

Silicon is used for other industries, also, such as metals, glasses, and ceramics. For these industries, a quite acceptable purity level is 99 percent (i.e., 1% impurity). For semiconductors, however, the purity must be far greater; on the order of 99.9999999% or one part per billion impurity. Even part per trillion impurity levels are of interest. The reason for emphasis upon such intense purity is that electronic properties of a material work at the atomic level. Even at one part per trillion impurity, a single cubic centimeter still contains about ten billion impurity atoms, which interfere with performance.

Solar cells are also semiconductor devices. They, too, benefit from high purity, but can tolerate somewhat lower purity. Thus, an industrial benchmark at this time for semiconductors is one part per billion (ppb), solar one part per million (ppm), metallurgical one part per hundred (percent).

The metallurgical grade silicon is thus likely to be the feedstock for purification for semiconductor and solar applications. Decades of intense development and experience have achieved the required minimal purity.

At this stage the silicon is in the form of spherical beads about one millimeter in diameter. Since both solar and semiconductor applications require a silicon sheet, the next step is consolidation of the beads into sheet form. The heat required to do this however, is highly likely to degrade the purity that has taken so much time and effort to achieve. Consolidation requires molten conditions. Molten silicon must be contained in a containment structure. At 1410° centigrade (silicon melting point), there really is no known material suitable to hold the melt. Molten silicon either dissolves or chemically attacks the container, leading to contamination as well as damage to expensive apparatus. Every effort is made to reduce the problem, but clearly this stage of silicon preparation is undesirably expensive and complicated.

Unfortunately, exceedingly high purity isn't enough, the silicon also must be crystalline. This means the individual silicon atoms must be arranged in a regular geometric pattern or lattice structure.

In the most expensive and exotic approach (Czochralski crystal pullers), a large crucible comprising high purity silica (melting point 1710° C.), silicon dioxide, sometimes called quartz, or silicon carbide (melting point 2600° C.) is heated under a protective atmosphere or vacuum to the melting point of silicon (1410° C.).

At this temperature, the silicon is very active and very inclined to chemically react with or dissolve its surroundings. In the melt region, portions of the silica and silicon carbide in contact with the molten silicon are dissolved, and reaction with any residual gasses or other impurities in the melt area will occur. This contaminates the silicon and limits the lifetime of the expensive crucibles.

The Czochralski apparatus is provided with means for bringing a small piece of silicon crystal in contact with the melt. If the temperature is carefully controlled, the crystal, instead of melting, prompts the solidification of melt material onto the crystal. If the rate is also carefully controlled, the solidification process copies the lattice geometry of the seed crystal and a large single crystal of silicon begins forming. As the solidified material is slowly pulled away, the melt is transformed into a large piece of single crystal silicon (sometimes called a boule).

The physical meaning of "melting" is that heat energy added to individual atoms (or molecules) eventually adds mobility to the point where the atoms are no longer bound by cohesive (solidification) forces. They are now liberated to diffuse freely. If careful cooling is now applied, the atoms organize themselves into the geometric lattice of the crystal structure. Simultaneously, impurity atoms, which have different sizes and cohesive forces associated with them, tend to be excluded from the organized crystallization. The Czochralski process thus has crystallization starting and progressing from a single point (so multiple crystals don't form) while systematically excluding contaminants.

To provide the silicon sheets, the boule of single crystal silicon must be sliced into sheets or wafers. In the Czochralski process, the slicing or sawing process results in the loss of 40 or 50 percent or more (in saw kerf) of this exotic, expensive material. Cleaning of the saw-cut surface by grinding, chemical etching and polishing also may be required. Clearly, such wafers are a remarkable—but expensive—achievement.

When the seed crystal is contacted to the melt in the Czochralski reactor, the melt region is quite small; some few millimeters in dimension. The pulling process, properly controlled, allows the solidification process to taper outward towards a larger diameter. This diameter typically shows prismatic features indicative of the atomic scale crystal organization and determines the size of wafers that can be produced. Years of development effort have moved towards larger diameter boules to the present state of the art of about 12 inches. The length of the boule is limited by the weight that can be held by the tail near the original seed and the volume of the Czochralski crucible or reactor. The outer part of the boule is ground off to a consistent diameter and also to remove a region that is higher in impurities. The tapered tails are also lost for production. These are losses which add to the saw kerf loss.

For solar cells, which may require large, i.e., greater than 12 inches, area, or a large length to width aspect ratio (for improved interconnects), such sizes of silicon sheet are simply unavailable. Work has been done on the pulling of silicon ribbon, rather than a boule, to reduce expense and kerf losses, but the ribbon technique has been plagued by quality and productivity problems.

In another conventional method known as edge-defined film fed growth (EFG), a silicon film or layer is formed without the need for pulling a crystal as in the CZ method. In some cases, the silicon sheet is formed from a nozzle structure comprising refractory materials such as molybdenum, tungsten or the like. However, in such instances the nozzle becomes a wetted structure and undesirable molybdenum silicon compounds are formed in the silicon.

If silicon feed stock of high purity beads can be melted in a suitable container, varieties of casting and molds can be used for solidification. Sawing is still required, material is multi-crystal rather than single crystal and purity is compromised. Such material is not suitable for semiconductors, but can be used for solar cells at the expense of efficiency and long-term reliability.

Another chronic issue is the aggressive nature of molten silicon as it reacts chemically with the crucible, leading to contamination and equipment damage. Therefore, what is needed is a new method for making a silicon sheet of high purity in a cost-effective manner, while eliminating sources of contamination.

Although great progress has been made in the availability of suitable silicon, many difficulties remain and much improvement is needed to provide silicon wafers of high purity and cost effectiveness.

What is needed is a new method for high-temperature melting of silicon, while preventing contamination by oxygen and other impurities, such as surface interaction with a containment vessel during the melting process. Such a simplified process for making a silicon wafer would minimize the cost of the ultimate product, thus expanding the opportunity for widespread practical application of silicon wafers in areas such as solar energy production.

SUMMARY

In order to achieve the foregoing objectives and other advantages, an aspect of the invention provides a cost effective process and apparatus for forming a silicon sheet or wafer of high purity (in a range of 1 part per billion) by melting high purity silicon beads without introducing any impurities during the melting process to provide a starting substrate for an efficient solar cell.

In another aspect of the invention, metallurgical grade silicon or high purity silicon beads developed from a fluidized bed process are melted in a cooled aluminum crucible, such that a non wetted interface is created between the molten silicon and the cooled supporting substrate that includes a surface layer of substantially inert aluminum oxide. That is, the molten silicon does not wet the surface of the supporting substrate and the surface of the supporting substrate does not chemically interact with the silicon. It is shown that, in spite of the enormous temperature difference, molten silicon (ca. 1450° C.) can be stabilized, by appropriate energy control, in direct (but non-wetted) contact with cold (ca. 40° C.) material such as aluminum. Thus, the silicon can be melted without the introduction of further impurities from interaction with the containment vessel. The inert non-wetted interface of aluminum oxide on the surface of an aluminum containment vessel further reduces risk of adhesion and contamination.

In a further aspect of the invention, opposed capacitor plates of cooled aluminum are used to contain and dielectrically heat silicon to a molten state while creating a substantially inert non-wetted interface, preventing chemical interaction between the silicon and the adjacent plates. The capacitor plates also can be used to shape the molten silicon and thereby control the thickness of the final consolidated sheet of silicon.

BRIEF DESCRIPTION OF THE DRAWINGS

The drawings are heuristic for clarity. The foregoing and other features, aspects and advantages of the present invention will become better understood with regard to the following description, appended claims and drawings in which:

DETAILED DESCRIPTION

Figure 1:
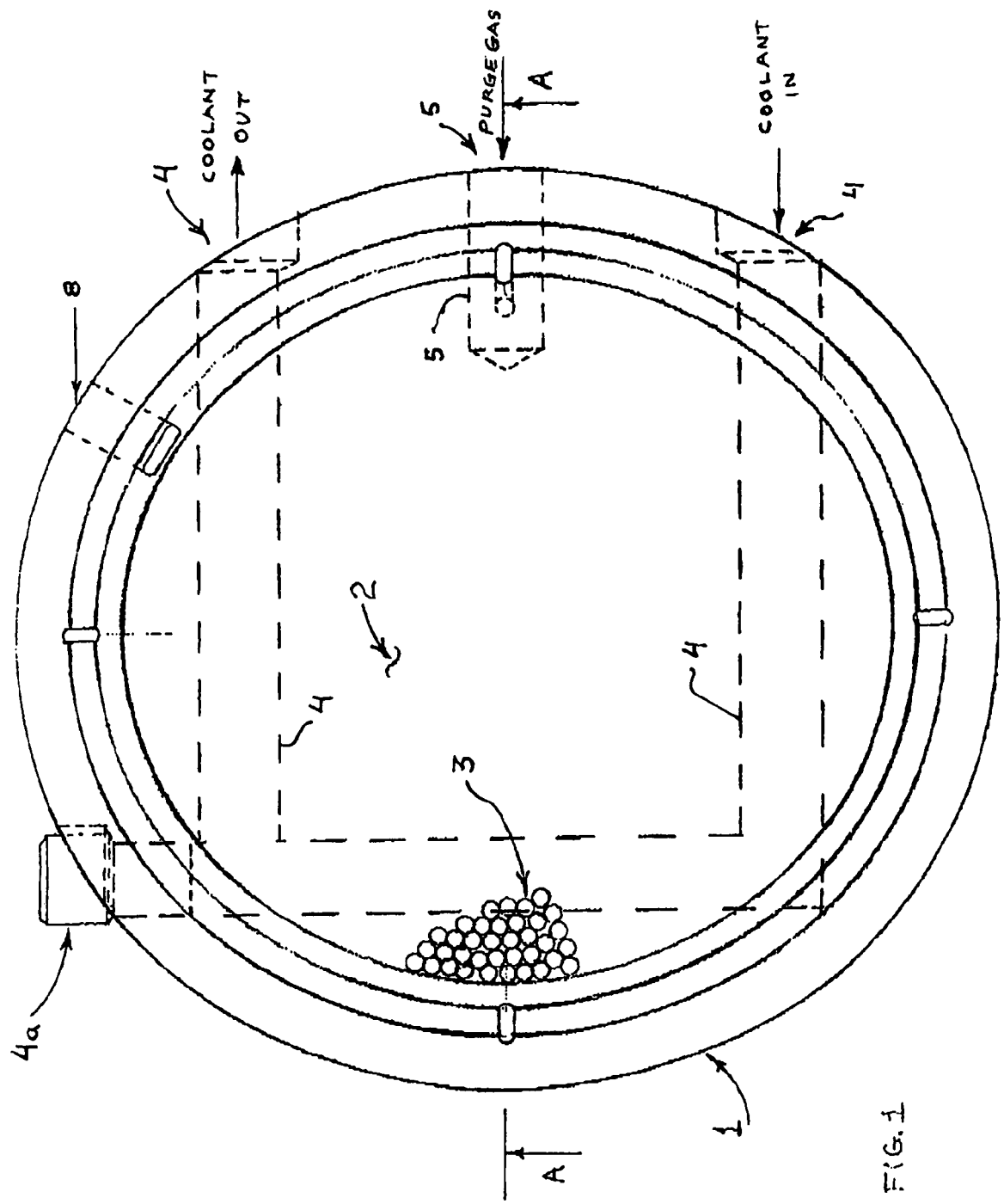
FIG. 1 is a diagram showing a top view of a crucible for melting a quantity of silicon beads to form a silicon wafer or sheet without wetting or other interaction with the crucible according to an aspect of the invention.

FIG. 1 is a diagram showing a top view of a crucible for melting a quantity of silicon beads to form a silicon wafer without wetting or other chemical interaction with the crucible. A piece of aluminum is formed into a crucible 1, which provides a surface 2 for supporting a layer of high purity silicon beads 3. The surface 2 is highly polished to provide cleanliness and heat reflection. A cooling channel 4 is further provided in the aluminum for a suitable coolant such as water to carry away unwanted heat. Cooling channel 4 is provided with a plug opening 4a.

Figure 2:
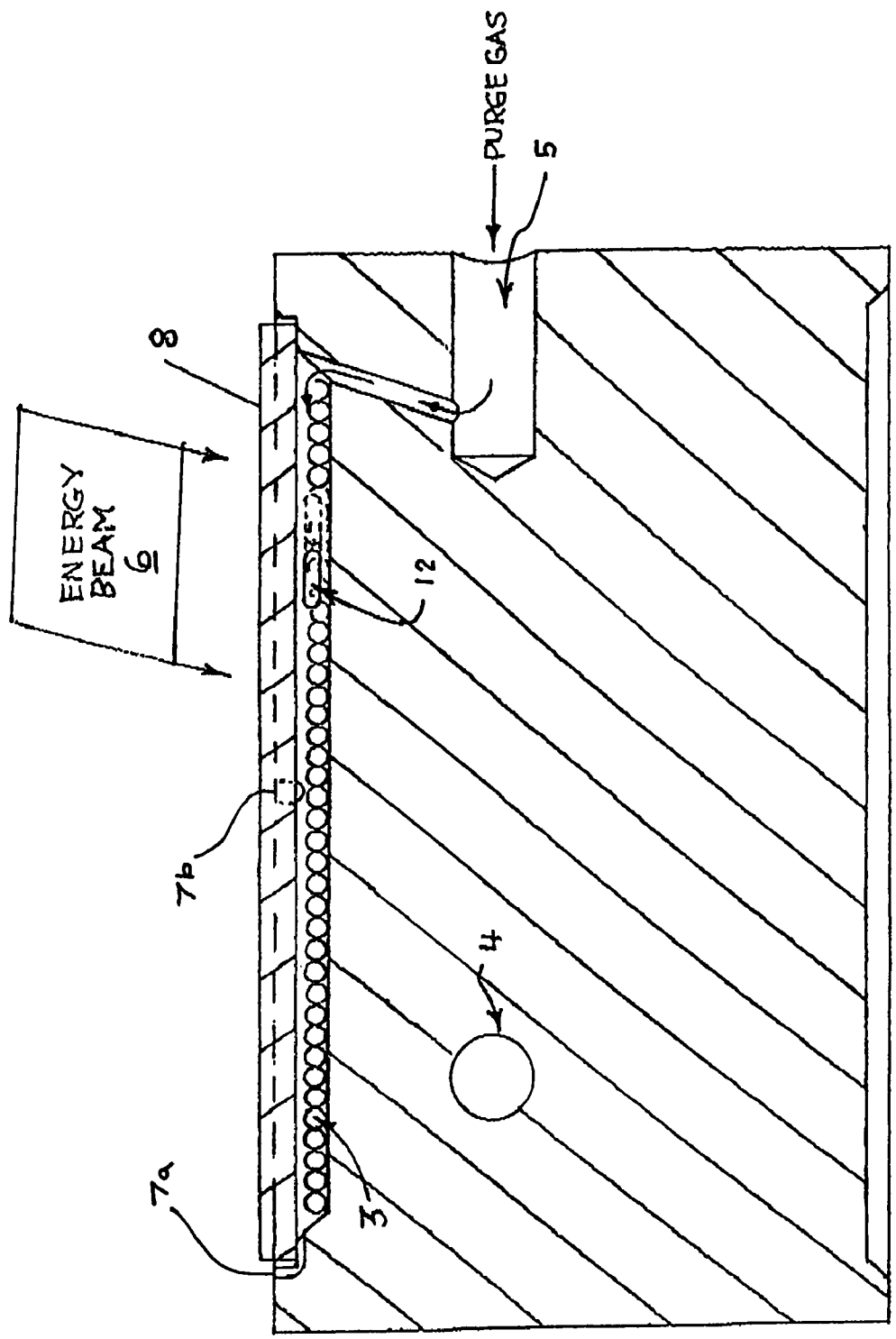
FIG. 2 is a cross sectional view along section A-A of FIG. 1.

In addition, a purge channel 5 is provided in the aluminum to provide a protective cover gas (such as 4% hydrogen in argon) for the silicon during heating purge vents are provided at 7a, 7b (FIG. 2). The 4% hydrogen cover gas advantageously improves the mobility of silicon atoms by combining with silicon to form silicon hydride compounds which are gaseous. The added hydrogen also interacts to eliminate residual native oxide (silica) on the beads, converting it to silicon and water vapor (which is carried away by purge flow).

In FIG. 2, heating energy is provided by a beam of electromagnetic energy 6, which might be anywhere in the electromagnetic spectrum. Optimally, the wavelength of the beam is chosen such that the cover glass is transparent, the silicon is absorbing, and the aluminum is reflective.

Figure 3:
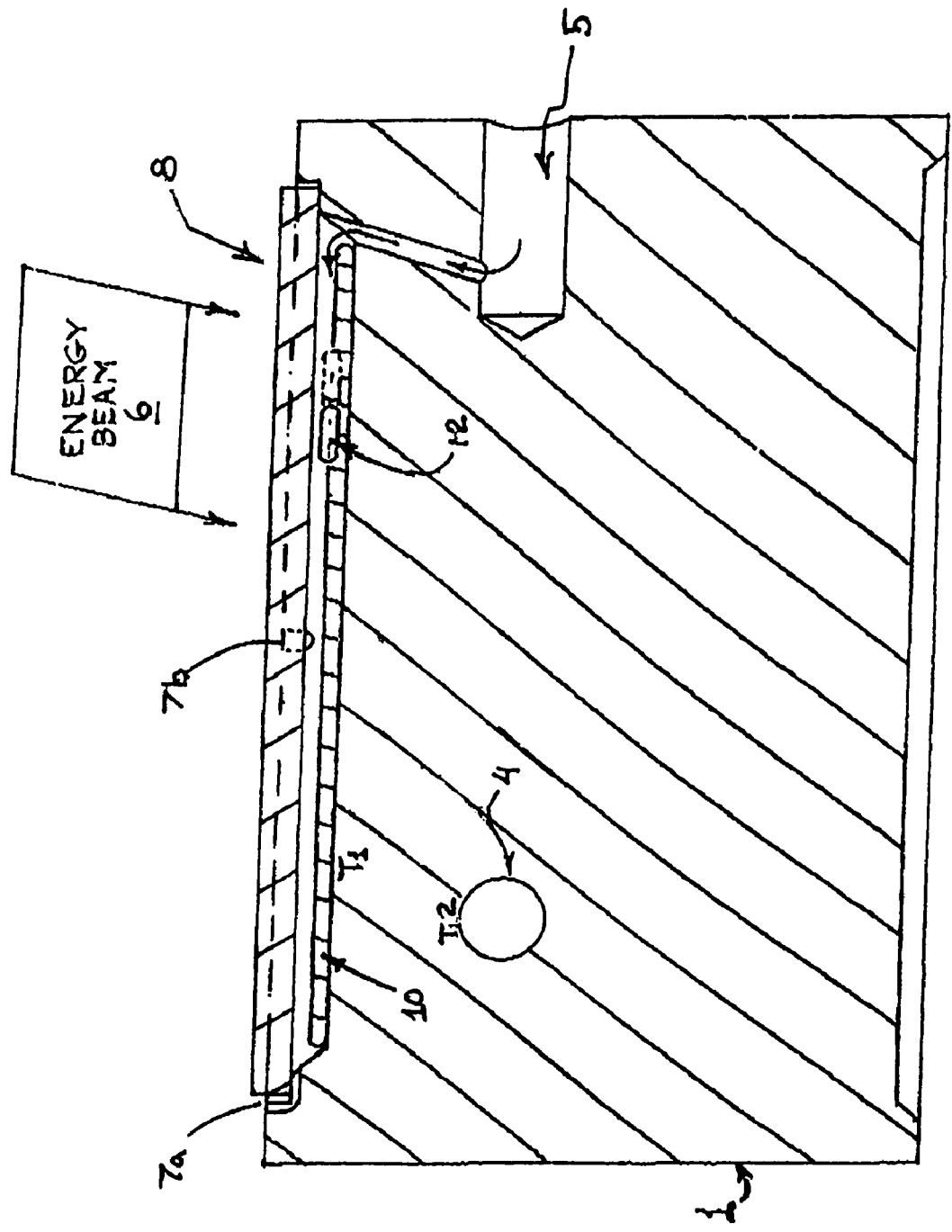
FIG. 3 is a cross sectional view along section A-A of FIG. 1 showing an equilibrium condition wherein molten silicon exists on a cold aluminum surface according to an aspect of the invention.

A cover glass 8 is dependent on transparency and is therefore vulnerable to obscurity, as could happen from transfer or deposition of silicon. However, if the crucible 1 is placed in a purged enclosure, no cover glass is needed. At some point there will be a balance where the molten silicon 10 in FIG. 3 is transferring heat to the aluminum crucible 1, and this heat is in turn is carried away by cooling channel 4. The high thermal conductivity of aluminum is an advantage in minimizing the temperature required (T1) adjacent to the molten silicon 10 to deliver the heat flow to the cooling channel 4 that is at a lower temperature (T2).

FIG. 3 shows an equilibrium condition wherein molten silicon (1410 degrees C. or higher) exists on a cold (ca. 40 degrees C.) aluminum surface of aluminum crucible 1. Heat loss from the silicon is carried away by the cooling channel 4 and replaced by the beam of energy 6. The low temperature of the aluminum minimizes wetting, contamination, heat transfer and adhesion. Silicon sheet is thus produced directly, with minimal risk of contamination, and eliminating losses such as saw kerf, surface grinding etc.

FIGS. 1, 2 and 3, therefore illustrate a process and apparatus for melting silicon and for crystallization of the melted silicon. The energy beam 6 can be any size or shape, or can be composed of multiple beams. If in the Czochralski fashion, a seed crystal is introduced through crystallization port 12 to an edge of the molten silicon 10 in FIG. 3, controlled cooling will cause crystallization to proceed throughout the melt as is well known. In addition, crystallization can take place faster because of the lower impurity level (impurities induce grain boundaries and the formation of multiple crystals) and because the distance the impurities have to travel to get out of the crystallization path is so much less than would be in the case of a large boule.

The demonstrated feasibility of cold aluminum serving as a container for molten silicon provides advantages in terms of great flexibility for molds and casting. If the crucible 1 in FIG. 3 is elongated, the energy beam 6 can be shaped to begin melting and crystallization near the seed crystal at crystallization port 12, and proceed at an appropriate rate to the other end of the crucible. This advantageously would provide long strips of single crystal silicon that are not presently available from a conventional process. Thus, using this aspect of the invention it is possible to facilitate more optimum shapes and dimensions for solar cells.

Since a single surface of cold aluminum against molten silicon is now possible, so are multiple surfaces, under appropriate conditions. For example, if a layer of molten silicon is produced, its thickness is determined by silicon properties, such as surface tension and density. If a second piece of aluminum is brought in contact with the melt, the thickness of the silicon now can be determined by the spacing of the aluminum. However, such a configuration would preclude the use of the beam 6 as a source of heat energy. This can be overcome, however, by using the aluminum plates as a source of energy for dielectrically heating the silicon.

Figure 4:
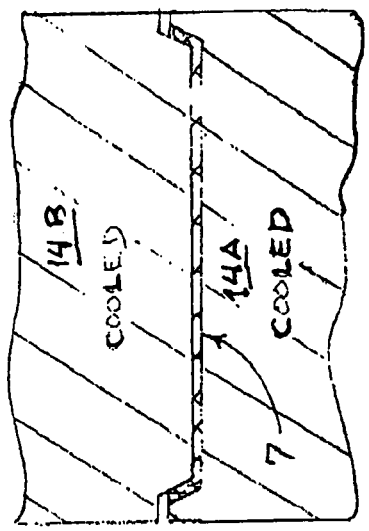
FIG. 4 is a general diagram of dielectric heating of a quantity of silicon beads in a cooled crucible according to an aspect of the invention.

Referring to FIG. 4, if two cooled aluminum plates, 14A and 14B, are closely disposed in parallel, they form a capacitor. Aluminum plates 14A and 14B also define a containment region for holding a quantity of silicon between the plates. A dielectric (or high resistance) material, such as silicon, between the plates is heated when an alternating current (typically high frequency) signal, such provided by microwave power supply 16 is connected between the plates. Thus, power supply 16 or other suitable power supply provides a means for coupling an alternating current between the plates for heating the silicon in the containment region to a molten state.

Figure 5:
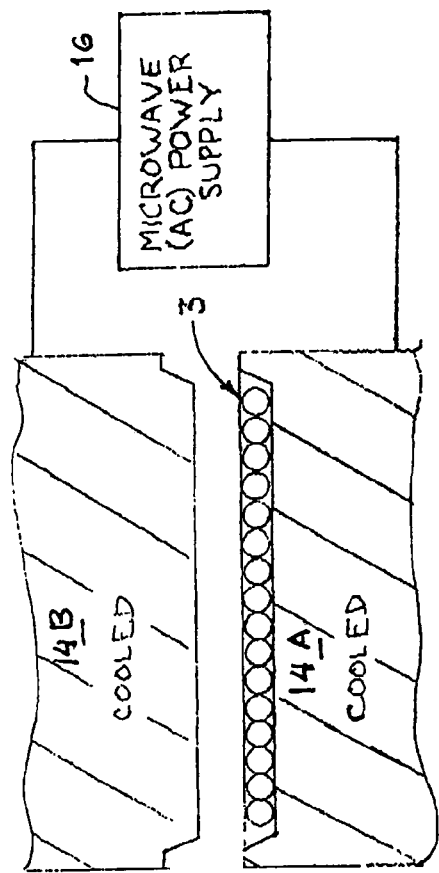
FIG. 5 is a general diagram of an equilibrium condition wherein molten silicon exists between two cooled plates acting in capacitor fashion to provide dielectric heating according to an aspect of the invention.
Figure 6:
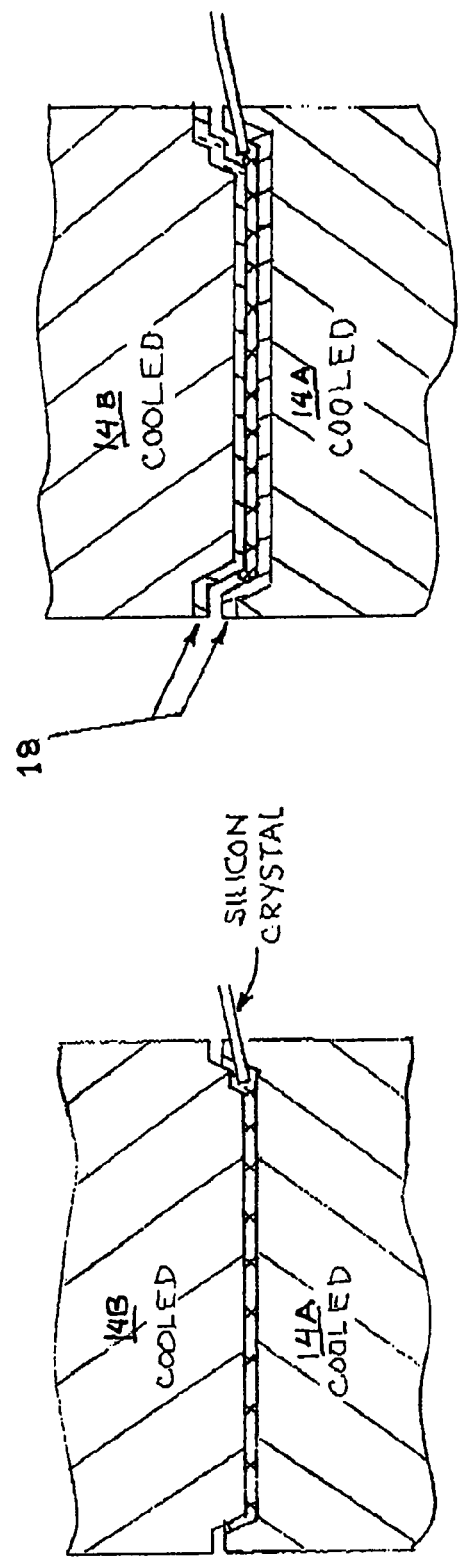
FIG. 6 is a general diagram showing introduction of a silicon seed crystal to propagate a desired crystalline structure to molten silicon between two cooled capacitor plates according to an aspect of the invention.

In such case, the aluminum plates become a source of energy as well as a non-contaminating cooled surface for heating and casting silicon (a dielectric) as shown in FIGS. 4, 5 and 6. Introduction of a silicon seed crystal for inducing single crystal growth would take place at an edge of plates 14A, B, as shown in FIG. 6.

Figure 7:
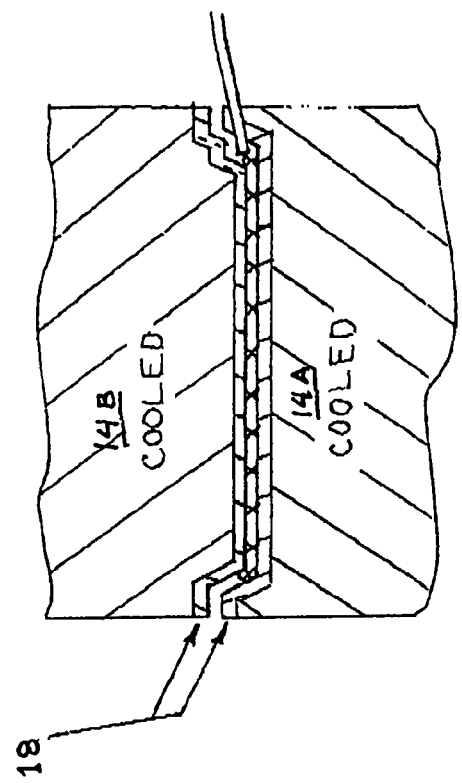
FIG. 7 is a general diagram showing an alternate embodiment of dielectric heating of silicon wherein thermally conductive electric insulators are placed on the capacitor plates according to an aspect of the invention.

There can be a risk of arcing between such closely spaced plates especially at high power levels. Accordingly, a layer of electrically insulating material would need to be provided on the surface of plates 14A, 14B. But electrical insulators tend to be heat insulators as well, which would mean that the surface near the molten silicon would get undesirably hot. These insulators also could dielectrically heat in the same way as the silicon depending on the A.C. frequency used and the material dielectric constant. Materials such as diamond (an electrical insulator, but four times more thermally conductive than copper), beryllium oxide and aluminum oxide are becoming increasingly available and are desired for such an application. Such thermally conductive electrical insulators 18 are provided on opposed surfaces of the cooled aluminum plates 14A, 14B as shown in FIG. 7.

While the invention has been described in connection with what are presently considered to be the most practical and preferred embodiments, it is to be understood that the invention is not limited to the disclosed embodiments, but rather is intended to cover various modifications and equivalent arrangements which are included within the spirit and scope of the following claims.

I claim:

1. An apparatus for providing a silicon sheet by melting a quantity of silicon comprising:
    a plate of material characterized by high thermal conductivity and high reflectivity, defining a containment region sized for holding a quantity of silicon beads in the shape of a desired wafer;
    a cover provided over the silicon to form an enclosure enabling introduction of a cover gas;
    a source of energy for heating the silicon in the containment region to a molten state;
    means for cooling the containment region, such that an interface is provided on the surface of the containment region, in contact with the molten silicon, that prevents wetting, chemical interaction, adhesion and heat transfer with the molten silicon; and
    means for controlled cooling of the silicon and for inducing desired crystallization as the silicon is cooled.

2. An apparatus according to claim 1, wherein the plate defining the containment region comprises aluminum or like material.

3. A process for melting silicon to provide a wafer or sheet of desired dimensions comprising:
    providing a containment vessel comprising a plate of material characterized by high thermal conductivity and high reflectivity, sized to contain a quantity of silicon beads in the shape of a desired wafer;
    enclosing the containment vessel to admit a cover gas;
    heating the silicon to a molten state with a beam of electromagnetic energy, wherein the energy of the beam is chosen from the electromagnetic spectrum, such that the cover is transparent, the silicon is absorbing, and the containment vessel is reflective with respect to the electromagnetic energy;
    cooling the containment vessel to prevent wetting of the containment vessel by the silicon;
    introducing a seed crystal to induce desired crystallization as the molten silicon is cooled.

4. An apparatus for providing a silicon sheet by melting a quantity of silicon comprising:
- a plate of material characterized by high thermal conductivity and high reflectivity, defining a containment region sized for holding a quantity of silicon beads in the shape of a desired wafer;
- a cover provided over the silicon to form an enclosure enabling introduction of a cover gas;
- a source of energy for heating the silicon in the containment region to a molten state;
- means for cooling the containment region, such that a non wetted interface is provided on the surface of the containment region, in contact with the molten silicon, that prevents chemical interaction, with the molten silicon; and
- means for controlled cooling of the silicon and for inducing desired crystallization as the silicon is cooled.

5. An apparatus for capacitively melting a quantity of silicon to form a silicon sheet comprising:
- first and second conductive plates disposed in parallel, defining a containment region sized for holding a quantity of silicon in the shape of a desired wafer;
- means for coupling an alternating current between the plates for heating the silicon in the containment region to a molten state;
- means for cooling the containment region, such that a non wetting interface is provided on the surface of the containment region, in contact with the molten silicon, that prevents chemical interaction with the molten silicon; and
- means for introducing a seed crystal to the molten silicon for inducing desired crystallization as the silicon is cooled.

6. An apparatus for capacitively melting a quantity of silicon to form a silicon sheet as in claim 5, wherein the conductive plates are aluminum.

7. An apparatus for capacitively melting a quantity of silicon to form a silicon sheet as in claim 6 further comprising an aluminum oxide layer provided on the surface of the containment region such that a non wetting interface is established between the molten silicon and the surface of the containment region that prevents chemical interaction.

* * * * *